United States Patent [19]

Yifrach

[11] Patent Number: 5,126,982
[45] Date of Patent: Jun. 30, 1992

[54] RADIO RECEIVER AND BUFFER SYSTEM THEREFORE

[76] Inventor: Aaron Yifrach, 19 Ayalon St., 78 616 Ashkelon, Israel

[21] Appl. No.: 580,250

[22] Filed: Sep. 10, 1990

[51] Int. Cl.$^5$ .......................... H04H 9/00; G11B 5/00
[52] U.S. Cl. .......................................... 369/7; 369/6; 360/7
[58] Field of Search ...................... 369/7, 292; 360/5,7; 455/186; 379/88; 381/34, 35, 36, 31

[56] References Cited

U.S. PATENT DOCUMENTS

| | | | |
|---|---|---|---|
| 3,538,265 | 11/1970 | Keeler | 369/7 |
| 3,576,406 | 4/1971 | Court | 360/7 |
| 3,645,539 | 2/1972 | Jenkins | 360/7 |
| 4,268,724 | 5/1981 | Hubbard | 369/7 |
| 4,408,309 | 11/1983 | Kiesling | 369/7 |
| 4,633,331 | 12/1986 | McGrady | 360/7 |
| 4,805,217 | 2/1989 | Morihiro | 369/7 |
| 4,841,574 | 6/1989 | Pham | 379/88 |
| 4,965,569 | 10/1990 | Bennett | 379/88 |

FOREIGN PATENT DOCUMENTS 9001838 2/1990 PCT Int'l Appl. ............. 369/7

*Primary Examiner*—Stuart S. Levy
*Assistant Examiner*—Joseph A. Rhoa
*Attorney, Agent, or Firm*—Benjamin J. Barish

[57] ABSTRACT

A buffer system for radio receivers includes a cyclic storage device connectable to a demodulator circuit for continuously storing the audio signals last outputted thereby only over a predetermined time interval, enabling the listener to jump-back to hear a preceding portion of the radio broadcasts. In one described embodiment, the listener normally hears the broadcasts in a real-time manner but may depress a button to hear the broadcasts in a delayed-time manner via the cyclic storage device. In a second described embodiment, the listener normally hears the broadcasts in a real-time manner, may depress a button to freeze a part of the broadcast in another storage device, and may later depress another button to play back the portion frozen.

10 Claims, 1 Drawing Sheet

RADIO RECEIVER AND BUFFER SYSTEM THEREFORE

FIELD AND BACKGROUND OF THE INVENTION

The present invention relates to radio receivers, and also to a buffer system for radio receivers.

It frequently happens that a person while listening to the radio is not particularly attentive to what is being broadcast but suddenly hears something which catches the listener's interest and which the listener would like to hear in full. This occurs especially when listening to the radio while operating an automotive vehicle since the attention of the driver, and sometimes of the passengers, is primarily occupied in operating the vehicle, in a conversation with another passenger, etc. Should the listener thus miss a part of a previously-broadcasted information, such information is lost to the listener unless the information is rebroadcasted.

OBJECTS AND BRIEF SUMMARY OF THE INVENTION

An object of the present invention is to provide a radio receiver, and particularly a buffer assembly for radio receivers, which permits the listener to play back information which had been previously broadcasted but not completely registered by the listener.

According to the present invention, there is provided a buffer system for radio receivers having a demodulator (or other processing) circuit outputting audio signals to an audio analog circuit for reproduction as sounds, the buffer system comprising: an analog-to-digital converter for converting to digital form the analog signals outputted by the processing circuit; a digital cyclic storage device connected to the demodulator circuit for continuously storing in digital form the audio signals last outputted thereby over a predetermined time interval; and a control circuit including mode selector means effective to select either: (a) a Normal-Listening Mode, wherein the audio circuit is connected to receive the audio signals from the demodulator circuit in a real-time manner, while the cyclic storage device continuously stores the audio signals last outputted by the demodulator circuit over a predetermined time interval; or (b) at least one other mode wherein the audio circuit is connected to receive the signals previously stored in the cyclic storage device. The buffer system further includes a digital-to-analog converter for reconverting to analog form the signals received by the audio circuit from the cyclic storage device.

Such a buffer assembly thus permits the listener normally to hear the radio broadcast in a continuous manner, but whenever it is desired to rehear information which was previously broadcasted, this may be done by reading-out the contents of the cyclic storage device stored during the time interval corresponding to that in which the missed information was broadcasted.

Two embodiments of the invention are described below for purposes of example.

In one described embodiment, the another mode is a Delayed-Listening Mode, wherein the audio circuit is connected to receive the audio signals in a delayed-time manner from the demodulator circuit via the cyclic storage device.

In a second described embodiment, the buffer system further includes a further storage device capable of storing all the information stored in the cyclic storage device during the predetermined time interval, and the mentioned at least one other mode includes: (a) a Freeze Mode, wherein the cyclic storage device is connected to the further storage device to transfer its contents at that instant to the further storage device while the cyclic storage device continues to store the audio signals last outputted by the demodulator circuit over the predetermined time interval; or (b) a Playback Mode, wherein the audio circuit is connected to the further storage device to be fed the contents of the further storage device.

The predetermined time interval in which information may be played back is preferably within the range of 10–120 seconds; in most cases, it would be about 60 seconds.

It would generally be desirable to construct the above-described buffer system in the form of a chip or printed-circuit board to be inserted into existing radio receivers for equipping them with the above-described capability of playing-back previously broadcasted information which may have been missed. The buffer system could of course also be included in radio receivers as originally constructed, and therefore, according to another aspect of the invention, there is provided a radio receiver having a demodulator circuit, an audio circuit, and a buffer circuit as described above inserted between the demodulator and audio circuits.

Further features and advantages of the invention will be apparent from the description below.

BRIEF DESCRIPTION OF THE DRAWINGS

The invention is herein described, by way of example only, with reference to the accompanying drawings, wherein.

DESCRIPTION OF PREFERRED EMBODIMENTS

Figure 1:
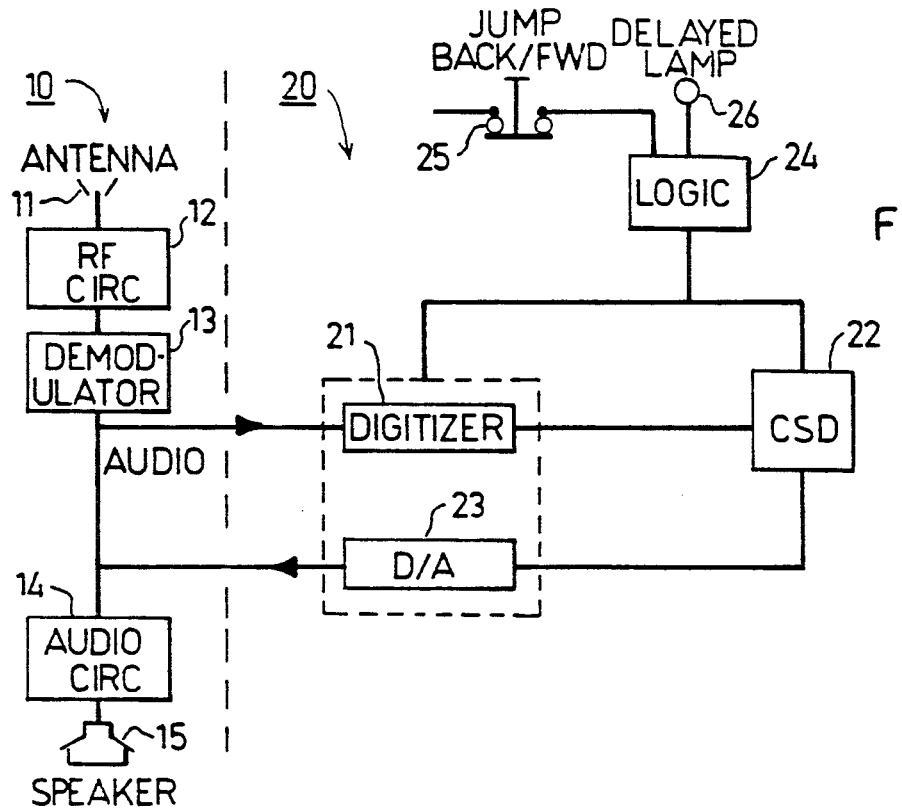
FIG. 1 is a block diagram illustrating one form of buffer system constructed in accordance with the present invention.

The Embodiment of FIG. 1

The buffer system illustrated in FIG. 1 is adapted to be included in a conventional radio receiver, generally designated 10, for equipping the receiver with the capability of playing back previously broadcasted information. The radio receiver 10, which may be of any conventional construction, includes an antenna 11 for receiving the RF signals, an RF amplifier circuit 12, a demodulator circuit 13 for extracting the audio signals from the carrier, and an audio circuit 14 for amplifying and further processing the audio signals before they are reproduced as sounds in the speaker 15.

According to the present invention, the radio receiver 10 illustrated in FIG. 1 is equipped with a buffer assembly, generally designated 20, inserted between the demodulator circuit 13 and the audio circuit 14.

The buffer system 20 illustrated in FIG. 1 comprises: a digitizer 21, namely an analog-to-digital converter, for converting the audio analog signals from the demodulator 13 to digital form; a cyclic storage device 22 for continuously storing the audio signals last outputted from demodulator 13 via digitizer 21; and a digital-to-analog converter 23 for reconverting to analog form the output from the cyclic storage device 22 before such output is fed to the audio circuit 14 of the receiver.

The cyclic storage device 22 is a digital storage device, such as a RAM (random access memory) having a storage capacity for continuously storing the audio signals last outputted by the demodulator 13 over a predetermined time interval. This time interval may be preselected for each particular application and would usually be within the range of 10-120 seconds, a preferred time interval being about 60 seconds.

The buffer system 20 illustrated in FIG. further includes a control system comprising a logic circuit 24 and a mode-selector switch 25 in the form of a JB/F (Jump Back/Forward) button conected to the logic circuit 24 which selects either of the following two modes of operation of the buffer system:

(a) When the JB/F button is not depressed, logic circuit 24 selects a Normal-Listening Mode, wherein the audio circuit 14 is connected to receive the audio signals from the demodulator circuit 13 in a real-time manner, while the cyclic storage device 22 continuously stores the audio signals last outputted by the demodulator circuit over a predetermined time interval.

(b) When the JB/F button is depressed, it selects a Delayed-Listening Mode, wherein the logic circuit 24 connects the audio circuit 14 to receive the audio signals in a delayed-time manner from the demodulator circuit 13 via the cyclic storage device 22.

(c) When the JB/F button is next depressed, logic circuit 24 returns the system to the Normal-Listening Mode.

Buffer system 20 further includes a light indicator 26 controlled by the logic circuit 24 such that the light indicator is not energized in the Normal-Listening Mode, but is energized in the Delayed-Listening Mode.

The system illustrated in FIG. 1 operates as follows:

Normally, the JB/F button 25 is not depressed, in which case the system operates according to the Normal-Listening Mode. In this mode, the audio circuit 14 is connected to receive the audio signals from the demodulator circuit 13 in a real-time manner, so that the listener hears the radio broadcasts in real-time. At the same time, the cyclic storage device continuously stores the audio signals last outputted by the demodulator circuit 13 over a predetermined time interval, e.g., the last 60 seconds. During this Normal-Listening mode of operation, indicator lamp 26 is not energized.

Should the listener wish to rehear information which had just been broadcasted, the listener depresses the JB/F button 25. This causes the logic circuit 24 to switch the system from the Normal-Listening Mode to the Delayed-Listening Mode. In this mode, the audio circuit 14 is connected to receive the audio signals in a delayed-time manner from the demodulator circuit 13 via the cyclic storage device, so that the listener hears the broadcast not in real-time, but rather in a 60-second delayed time. Thus, the listener will rehear the information previously broadcasted within the past 60 seconds and from then on in a 60-second delayed time.

At any time thereafter, the listener may depress the JB/F button again, whereupon the logic circuit 24 re-switches the system back to the Normal-Listening Mode. The audio circuit 14 is then reconnected to receive the audio signals from the demodulator circuit 13 in a real-time manner. The cyclic storage device 22, however, continuously stores the audio signals last outputted by the demodulator circuit over the 60-second time interval, so that this information is again available to the listener whenever desired by again depressing the JB/F button.

When indicator lamp 26 is not energized, this indicates to the listener that the system is in the Normal-Listening Mode and the broadcasts are being heard in a real-time manner; whereas when the indicator lamp 26 is energized, this indicates that the system is in the Delayed-Listening Mode wherein the broadcasts are being heard in a delayed-time manner.

Figure 2:
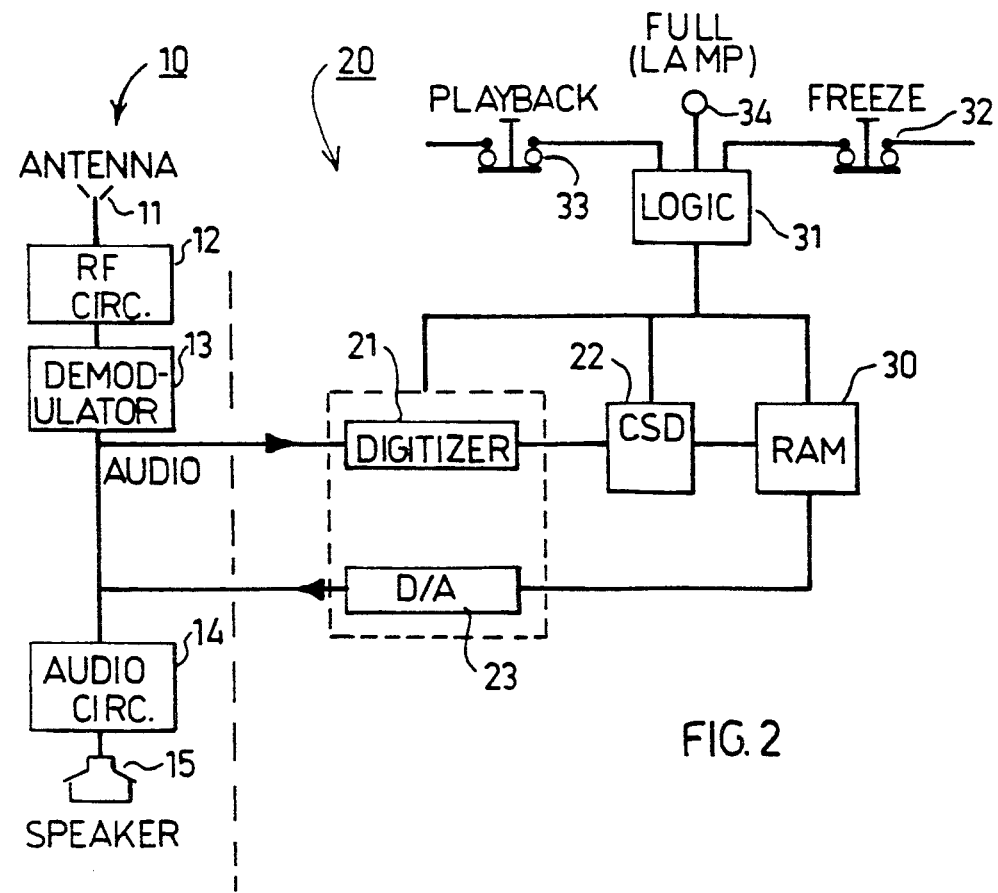
FIG. 2 is a block diagram illustrating a second form of buffer system constructed in accordance with the invention.

The Embodiment of FIG. 2

The buffer system illustrated in FIG. 2 is very similar to that of FIG. 1, except that it enables the listener not only to hear the radio broadcasts in a real-time manner, but also to freeze a portion of the broadcast for later playback whenever desired.

Thus, the buffer system illustrated in FIG. 2 includes all the elements of the conventional radio receiver 10, which elements have been correspondingly numbered. It also includes the digitizer 21, cyclic storage device 22, and digital-to-analog converter 23 of the buffer system 20, which elements have also been correspondingly numbered. However, the system of FIG. 2 includes, in addition, a further storage device 30, and another logic circuit 31 controlled by two depressible buttons, namely a Freeze button 32, and a Playback button 33. The further storage device 30, in the form of another RAM, is capable of storing all the information stored in the cyclic storage device 22. A light indicator 34 is controlled by the logic circuit 31. Logic circuit 31 is in turn controlled by the two buttons 32 and 33, in the following manner:

(a) When neither Freeze button 32 or Playback button 33 is depressed, the logic circuit 31 operates the system according to the Normal-Listening Mode wherein, as described above with respect to the FIG. 1 embodiment, the audio circuit 14 is connected to receive the audio signals from the demodulator circuit 13 in a real-time manner, while the cyclic storage device 22 continuously stores the audio signals last outputted by the demodulator circuit 13 over a predetermined time interval, e.g., 60 seconds.

(b) When the Freeze button 32 is depressed, it controls the logic circuit 31 to select a Freeze Mode. In this mode, the cyclic storage device 22 is connected to the further storage device 30 to transfer its contents at that instant to the further storage device. That is, the last 60-seconds of the broadcast are thus "frozen" in the further storage device 30, while the cyclic storage device 22 continues to store the audio signals last outputted by the demodulator circuit 13 over the predetermined 60-second time interval. If the Freeze Button 32 should be again depressed, the logic circuit 31 causes the previous contents of the further storage device 30 to be replaced by the contents of the cyclic storage device 22, i.e., the last 60-seconds of the broadcast. The listener, however, continues to hear the broadcasts in a real-time manner.

(c) Now whenever the listener wishes to play back the 60-seconds of a broadcast "frozen" by depressing the Freeze button 32, this is effected by depressing the Playback button 33, which controls the logic circuit 31 to select the Playback Mode. In this mode, the audio circuit 14 is connected to the further storage device 30 to receive its contents, thereby playing back to the listener the 60-seconds of broadcast frozen in that device. After the contents of the further storage device 30 have been fed to the audio circuit 14, the system automatically returns to the Normal-Listening Mode.

Indicator lamp 34 is controlled by the logic circuit 31 such that: (a) it is not energized in the Normal-Listening Mode; (b) it is energized in the Freeze Mode, and (c) is caused to "blink" in the Playback Mode.

While the invention has been described with respect to two preferred embodiments, it will be appreciated that many variations, modifications and other applications of the invention may be made.

What is claimed is:

1. A buffer system for radio receivers having a processing circuit outputting audio analog signals to an audio circuit for reproduction as sounds, said buffer system comprising:
   an analog-to-digital converter for converting to digital form the analog signals outputted by said processing circuit;
   a digital cyclic storage device connected to said processing circuit for continuously storing in digital form the audio signals last outputted thereby over a predetermined time interval;
   a further storage device capable of storing all the information stored in said cyclic storage device during said predetermined time interval;
   a control circuit including mode selector means effective to select from:
   (a) a Normal-Listening Mode, wherein the audio circuit is connected to receive the audio signals from the processing circuit in a real-time manner, while the cyclic storage device continuously stores the audio signals last outputted by the processing circuit over a predetermined time interval;
   (b) a Freeze Mode, wherein the cyclic storage device is connected to the further storage device to transfer its contents at that instant to the further storage device while the cyclic storage device continues to store the audio signals last outputted by said processing circuit over the predetermined time interval; and
   (c) a Playback Mode, wherein the audio circuit is connected to the further storage device to be fed the contents of the further storage device;
   and a digital-to-analog converter for reconverting to analog form the signals received by the audio circuit from said cyclic storage device.

2. The buffer system according to claim 1, wherein said Playback Mode is also effective automatically to return the system to the Normal-Listening Mode after the contents of the further storage device have been fed to the audio circuit.

3. The buffer system according to claim 2, wherein said mode selector means comprises first and second depressible buttons controlling said control system such that:
   (a) when both buttons are not depressed, the mode selector means selects the Normal-Listening Mode;
   (b) when said first button is depressed, the mode selector means selects the Freeze Mode; and
   (c) when said second button is depressed, the mode selector means selects the Playback Mode.

4. The buffer system according to claim 2, further including a light indicator, said control circuit energizing said light indicator in the Freeze Mode, and blinking the light indicator in the Playback Mode.

5. The buffer system according to claim 1, wherein said predetermined time interval is within the range of 10 to 120 seconds.

6. The buffer system according to claim 1, wherein said predetermined time interval is about 60 seconds.

7. A radio receiver comprising:
   a demodulator circuit outputting audio signals;
   an audio circuit for reproducing the audio analog signals in the form of sounds;
   and a buffer system including:
   an analog-to-digital converter for converting to digital form the analog signals outputted by said processing circuit;
   a digital cyclic storage device connected to the demodulator circuit for continuously storing in digital form the audio signals last outputted thereby over a predetermined time interval;
   a further storage device capable of storing all the information stored in said cyclic storage device during said predetermined time interval;
   a control circuit including mode selector means effective to select from:
   (a) a Normal-Listening Mode, wherein the audio circuit is connected to receive the audio signals from the demodulator circuit in a real-time manner, while the cyclic storage device continuously stores the audio signals last outputted by the demodulator circuit over a predetermined time interval;
   (b) a Freeze Mode, wherein the cyclic storage device is connected to the further storage device to transfer its contents at that instant to the further storage device while the cyclic storage device continues to store the audio signals last outputted by said processing circuit over the predetermined time interval; and
   (c) a Playback Mode, wherein the audio circuit is connected to the further storage device to be fed the contents of the further storage device;
   and a digital-to-analog converter for reconverting to analog from the signals received by the audio circuit from said cyclic storage device.

8. The radio receiver according to claim 7, wherein said Playback Mode is also effective automatically to return the system to the Normal-Listening Mode after the contents of the further storage device have been fed to the audio circuit.

9. The radio receiver according to claim 8, wherein said mode selector means comprises first and second depressible buttons controlling said control system such that:
   (a) when both buttons are not depressed, the mode selector means selects the Normal-Listening Mode;
   (b) when said first button is depressed, the mode selector means selects the Freeze Mode; and
   (c) when said second button is depressed, the mode selector means selects the Playback Mode.

10. The radio receiver according to claim 8, further including a light indicator, said control circuit energizing said light indicator in the Freeze Mode, and blinking the light indicator in the Playback Mode.

* * * * *